United States Patent
Dreps et al.

(10) Patent No.: US 6,772,250 B2
(45) Date of Patent: Aug. 3, 2004

(54) BOUNDARY SCANNABLE ONE BIT PRECOMPENSATED CMOS DRIVER WITH COMPENSATING PULSE WIDTH CONTROL

(75) Inventors: Daniel Mark Dreps, Georgetown, TX (US); Anand Haridass, Austin, TX (US); Bao Gia-Harvey Truong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 503 days.

(21) Appl. No.: 09/810,058

(22) Filed: Mar. 15, 2001

(65) Prior Publication Data

US 2002/0133650 A1 Sep. 19, 2002

(51) Int. Cl.[7] .......................... G06F 13/00; H03K 19/00
(52) U.S. Cl. ............................ 710/100; 326/21; 326/52
(58) Field of Search .......................... 710/100; 326/21, 326/82, 88, 27, 33, 52; 327/410; 360/41; 361/51, 91.1

(56) References Cited

U.S. PATENT DOCUMENTS

| | | | | |
|---|---|---|---|---|
| 4,622,482 A | * | 11/1986 | Ganger | 327/410 |
| 4,684,824 A | * | 8/1987 | Moberg | 326/82 |
| 4,737,667 A | * | 4/1988 | Tihanyi | 326/88 |
| 4,906,867 A | * | 3/1990 | Petty | 326/27 |
| 4,965,873 A | * | 10/1990 | White | 360/41 |
| 5,008,568 A | * | 4/1991 | Leung et al. | 326/27 |
| 5,060,089 A | * | 10/1991 | Cleveland | 360/51 |
| 5,121,000 A | * | 6/1992 | Naghshineh | 326/33 |
| 5,218,239 A | * | 6/1993 | Boomer | 326/27 |
| 5,528,166 A | * | 6/1996 | Iikbahar | 326/27 |
| 6,088,206 A | * | 7/2000 | Chan et al. | 361/91.1 |

* cited by examiner

Primary Examiner—Xuan M. Thai
(74) Attorney, Agent, or Firm—Duke W. Yee; Casimer K. Salys; Stephen R. Tkacs

(57) ABSTRACT

An improved data driver, method, and system for driving data with an improved slew rate and eye opening is provided. In one embodiment, the data driver includes a non-precompensating data driver and a precompensating data driver. The non-precompensating driver generates a non-precompensating output data pulse corresponding to input data. The non-precompensating data driver generates a pulse in response to every input data bit received. The precompensating driver generates the precompensating pulse only in response to a transition from one data state to a second data state between consecutive data bits. The precompensating data pulse is shorter in duration than the non-precompensating output data. The output data from the data drive is the sum of the non-precompensating output data pulse and the precompensating output data pulse.

20 Claims, 2 Drawing Sheets

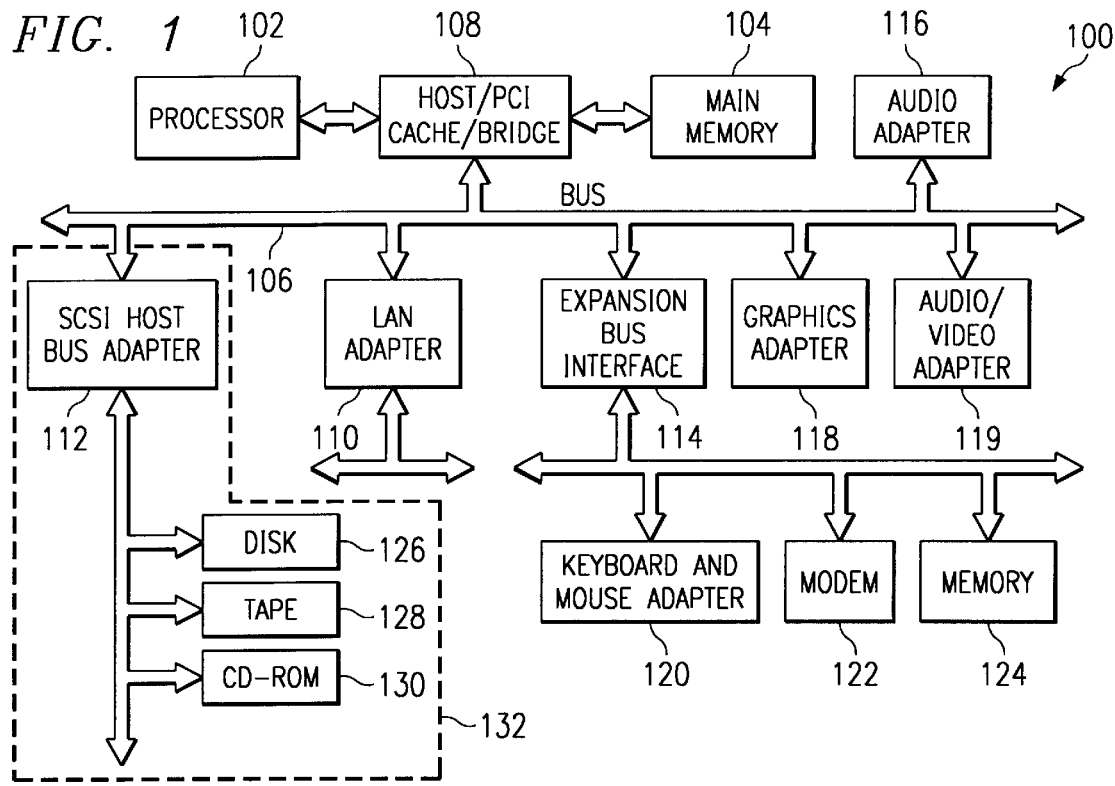

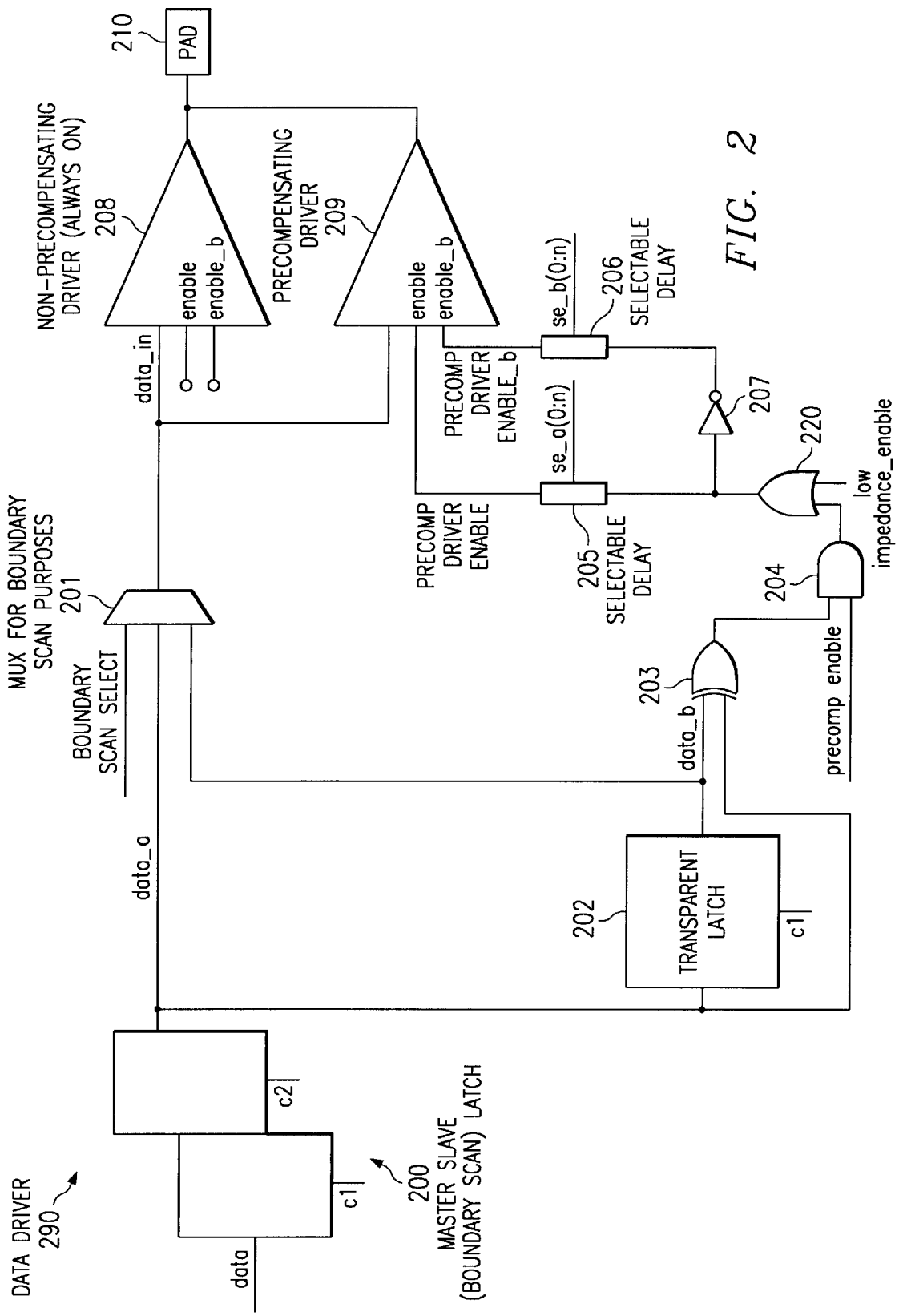

BOUNDARY SCANNABLE ONE BIT PRECOMPENSATED CMOS DRIVER WITH COMPENSATING PULSE WIDTH CONTROL

BACKGROUND OF THE INVENTION

1. Technical Field

The present invention relates to an improved data driver.

2. Description of Related Art

Computers have evolved during the past several decades from large bulky slow machines used primarily by businesses and scientists to process large accounting and mathematical calculations to smaller compact faster machines used by people for a multitude of activities. Thus, now, although computers are still used in accounting and by scientists, computers are also used by other professions and even by individuals for home use. Increasing speed of computers has lead to uses of computers for graphically intensive applications such as for automated design or computer animation.

As computers continue to increase in speed, computers will be able to perform more functions than currently performed due to current limitations on processor speed. Furthermore, increased computer speed will allow for activities currently performed by computers to be improved. For example, increased computer speed will not only result in quicker rendering of graphics, it will also result in the ability to render graphics and animation in much finer detail than is currently available.

There are, however, many problems that must be overcome in order to increase the speed and performance of computers, or for that matter, in other type of data processing systems. One problem is that when data is driven at an increased frequency (faster speed), that over long lossy transmission media, such as may be encountered in the busses connecting various chips or components of a data processing system, that higher frequency components of the data are attenuated resulting in pulse width distortion and pulse amplitude reduction. The result is added jitter and a smaller eye opening. An eye opening, as is well known in the art, is a graphical representation of the window of time in which data is valid and may be interpreted correctly by a logic element. These problems result in an inability in components receiving the data to determine whether the data is a logical one or zero, thereby inducing errors in calculations performed by the data processing system. Therefore, it would be desirable to have a data driver for driving data off a chip that results in an increased eye opening thus allowing data to be driven at a higher frequency.

SUMMARY OF THE INVENTION

The present invention provides an improved data driver, method, and system for driving data with an improved slew rate and eye opening. In one embodiment, the data driver includes a non-precompensating data driver and a precompensating data driver. The non-precompensating driver generates a non-precompensating output data pulse corresponding to input data. The non-precompensating data driver generates a pulse in response to every input data bit received. The precompensating driver generates the precompensating pulse only in response to a transition from one data state to a second data state between consecutive data bits. The precompensating data pulse is shorter in duration than the non-precompensating output data. The output data from the data drive is the sum of the non-precompensating output data pulse and the precompensating output data pulse.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 depicts a block diagram illustrating a data processing system in which the present invention may be implemented;

FIG. 2 depicts a logic topology of a circuit that allows "normal boundary scan" test methods to be applied to precompensating designs and the ability to schmoo the design pulse width of the precomp pulse to optimize the link performance in accordance with a preferred embodiment of the present invention; and FIG. 3 depicts a timing diagram for a precompensated CMOS driver in accordance with the present invention.

DETAILED DESCRIPTION OF THE PREFERRED EMBODIMENT

With reference now to FIG. 1, a block diagram illustrating a data processing system is depicted in which the present invention may be implemented. Data processing system 100 is an example of a general purpose computer. Data processing system 100 employs a peripheral component interconnect (PCI) local bus architecture. Although the depicted example employs a PCI bus, other bus architectures such as Accelerated Graphics Port (AGP) and Industry Standard Architecture (ISA) may be used. Processor 102 and main memory 104 are connected to PCI local bus 106 through PCI bridge 108. PCI bridge 108 also may include an integrated memory controller and cache memory for processor 102. Additional connections to PCI local bus 106 may be made through direct component interconnection or through add-in boards. In the depicted example, local area network (LAN) adapter 110, SCSI host bus adapter 112, and expansion bus interface 114 are connected to PCI local bus 106 by direct component connection. In contrast, audio adapter 116, graphics adapter 118, and audio/video adapter 119 are connected to PCI local bus 106 by add-in boards inserted into expansion slots. Expansion bus interface 114 provides a connection for a keyboard and mouse adapter 120, modem 122, and additional memory 124. Small computer system interface (SCSI) host bus adapter 112 provides a connection for hard disk drive 126, tape drive 128, and CD-ROM drive 130. Typical PCI local bus implementations will support three or four PCI expansion slots or add-in connectors.

An operating system runs on processor 102 and is used to coordinate and provide control of various components within data processing system 100 in FIG. 1. The operating system may be a commercially available operating system, such as Windows 2000, which is available from Microsoft Corporation. An object oriented programming system such as Java may run in conjunction with the operating system and provide calls to the operating system from Java programs or applications executing on data processing system 100. "Java" is a trademark of Sun Microsystems, Inc. Instructions for the operating system, the object-oriented operating system, and applications or programs are located on storage devices, such as hard disk drive 126, and may be loaded into main memory 104 for execution by processor 102.

Those of ordinary skill in the art will appreciate that the hardware in FIG. 1 may vary depending on the implementation. Other internal hardware or peripheral devices, such as flash ROM (or equivalent nonvolatile memory) or optical disk drives and the like, may be used in addition to or in place of the hardware depicted in FIG. 1. Also, the processes of the present invention may be applied to a multiprocessor data processing system.

As another example, data processing system 100 may be a stand-alone system configured to be bootable without relying on some type of network communication interface, whether or not data processing system 100 comprises some type of network communication interface. As a further example, data processing system 100 may be a Personal Digital Assistant (PDA) device, which is configured with ROM and/or flash ROM in order to provide non-volatile memory for storing operating system files and/or user-generated data.

The depicted example in FIG. 1 and above-described examples are not meant to imply architectural limitations. For example, data processing system 100 also may be a notebook computer or hand held computer in addition to taking the form of a PDA. Data processing system 100 also may be a kiosk or a Web appliance.

With reference now to FIG. 2, a logic topology of a circuit that allows "normal boundary scan" test methods to be applied to precompensating designs and the ability to schmoo the design (to try several variations of the design to determine an optimum design) pulse width of the precomp pulse to optimize the link performance is depicted in accordance with a preferred embodiment of the present invention. Data driver 290 may be implemented within an integrated chip for use in a data processing system, such as, for example, data processing system 100 in FIG. 1. Data driver may also be implemented in chips for use with other types of electronic devices, such as, for example, telephones, wireless telephones. Typically, the data driver 290 as depicted in FIG. 2 will be incorporated near the edge of a integrated circuit chip, such as, for example, processor 102 in FIG. 1, to drive data off of the chip and onto a bus to carry the data to another component within a data processing system.

The topology includes a master/slave latch 200, a test mux 201, a transparent latch 202, an exclusive OR gate 203, an AND gate 204, OR gate 220, two selectable delays 205–206, an inverter 207, a non-precompensating driver 208, a pre-compensating driver 209, and a pad 210. Data is input to the master slave latch 200 which is pulsed by two clock signals c1 and c2. The output data_a of the master/slave latch 200 is coupled to one input of the mux 201, to the input of transparent latch 202, which is pulsed by clock signal cl, and to one input of the exclusive OR gate 203. This master/slave latch 200 is used to launch the data into the driver predrive (MUX 201) only if the data driver 290 is in non-precompensating mode (i.e. boundary scan mode). If the data driver 290 is in precompensating mode, the data is launched into the driver predrive (Mux 201) from transparent latch 202. Mux 201 is a test mux that is used for DC boundary scan to drive data data_in into non-precompensating driver 208. Input data_a is output as output data data_in when mode select boundary scan select signal is on and input data data_b is output as output data data_in when not in boundary scan mode. Non-precompensating driver 208 is the "always on" driver. The slew rate (i.e. edge rate—the speed at which a pulse goes from logical 0 to 1 or from logical 1 to 0) and impedance of non-precompensating driver 208 can be set as optimization requires. Typically, for 50 ohm media, the impedance of this stage is set between 35 and 50 ohms.

The transparent latch 202 delays data_b, a delay that is utilized to "queue the data." The delay chosen in the depicted example is ½ a processor clock cycle. Selectable delays 205 and 206 can be used to adjust the delay if the ½ processor clock is not the proper width for optimization.

The output data_in from the mux 201 is coupled to one of the three inputs for the non-precompensating driver 208 and to one of the three inputs for precompensating driver 209.

The output data_b of transparent latch 202 is also coupled to one of the inputs to exclusive OR gate 203, the other input receiving data_a. The exclusive OR gate 203 is utilized to generate a pulse for every transition of data_a. (A transition is a change in the bit value from high to low or low to high.) The output of the exclusive OR gate 203 is coupled to one input of the AND gate 204. The other input of the AND gate 204 is coupled to an enable signal precomp enable. AND gate 204 allows for turning off precompensating driver 209 if not needed. Drivers 208 and 209 may need to be placed in high impedance mode and AND gate 204 allows driver 209 to be placed in a high impedance mode.

The output of the AND gate 204 is to one input of OR gate 220. The other input of OR gate 220 is coupled to an enable signal low-impedance enable. Enable signal low-impedance-enable allows the driver 290 to be placed into a mode in which the precompensating driver 209 is always enabled regardless of whether a transition has taken place between successive bits of data. This has the effect of making the driver 290 operate as a low-impedance driver in which individual drivers 208 and 209 operate in parallel, which may be desirable for optimal performance in some cases. Thus, if enable signal low-impedance enable is high, then the precompensating driver 209 is always enabled. If enable signal low-impedance enable is low, then precompensating driver 209 is disabled except when the output from AND gate 204 is high. Therefore, the combination of AND gate 204 and OR gate 220 allow the data driver 290 to operate in three different modes: a mode in which precompensating driver 209 is always enabled, a mode in which precompensating driver 209 turns on only during a transition from one logical state to another logical state between successive data bits of data_a, and a mode in which the precompensating driver 209 is disabled regardless of any transition in data_a. Thus, through the use of the enable signals precomp enable and low-impedance_enable, data driver 290 may be optimized for various conditions.

The output of OR gate 220 is coupled to the input of the inverter 207 and to the input of selectable delay 205. The inverter 207 is utilized because it is desirable to have a true and complement enable signal, but is not necessary. The output of inverter 207 is coupled to the input of selectable delay 206. The selectable delays 205–206 may be implemented as inverter strings or as more complex delay lines. Vectors se_a(0:n) and se_b(0:n) can be used for complex and independent control of the precomp enable signals precomp driver enable and precomp driver enable_b.

The output precomp driver enable and precomp driver enable_b signals of selectable delay 205 are coupled to two inputs of precompensating driver 209. The outputs of precompensating driver 209 and non-precompensating driver 208 are coupled to each other and to pad 210. Pad 210 is simply the C4 connection, but could be, for example, a wirebond pad.

The precompensating driver 209 is the "switched driver." The precompensating driver 209 is capable of being turned on and off whenever a transition occurs. The precompensating driver 209 must be designed to operate within the bounds of three constraints. The three constraints on precompensating driver 209 are the output impedance, the output slew rate, and the pulse widths of enable signals precompensating driver enable and precompensating driver enable_b. Typically, the precompensating driver 209 will have an output impedance between 30 and 50 ohms and the slew rate of the output of precompensating driver 209 should be set to a value that provides the best performance (i.e results in the best or largest eye opening of the combined output of drivers 208 and 209). This value of the slew rate of the output of percompensating driver 209 is a function of the internal settings of percompensating driver 209 and may be determined by trial and error for the particular circuits and receivers utilized in a particular implementation. The time at which the precompensating driver pulse is generated as compared to the timing of data_b may be varied to provide better performance as determined by improved slew rate of the output of data driver 290 as determined at the receiver. The delay of selectable delays 205 and 206 may be set after chip fabrication by software selection of appropriate registers within selectable delays 205 and 206 after testing various settings to determine a substantially optimal setting as determined by the eye opening of the output data as observed at a receiver thus allowing for variations in settings needed to accommodate various wire lengths and impedances.

With reference now to FIG. 3, a timing diagram of the topology depicted in FIG. 2 is illustrated in accordance with the present invention. Clock signals c1 and c2 are out of phase by 180 degrees. Data stream data_a is the same as data stream data except that it is delayed by one complete clock cycle. Data stream data_b is the same as data stream data_a except that it lags data stream data_a by one half of a clock cycle. If data streams data_a and data_b are the same at exclusive OR gate 203, as discussed above, no precompensating enable precomp enable signal is generated since such a situation indicates that no transition is taking place between the preceding data bit and a current data bit. However, if the two signals are different, a precompensating enable precomp enable signal is generated since a transition is taking place between the preceding data bit and the current data bit (i.e., the state is transitioning from a logical 1 to a logical 0 or vice versa). The precompensating driver enable signals precomp driver enable and precomp driver enable_b are complementary. Thus, at a transition, a short precompensating signal is generated by precompensating driver 209 at a time relative to the data signal output by non-precompensating driver 208 that can be optimally set by appropriate selections of selectable delays 205 and 206. This precompensating signal has the effect of increasing the slew rate of the data being driven into pad 210 thus increasing the eye opening without increasing the intersymbolic interference (ISI).

By way of explanation, consider the following example. If a driver is coupled to a wire to drive data to a reciever on the far end of the wire and the driver is configured such that the impedance of the driver matches the impedance of the wire, at the far end of the wire, the voltage swing between high and low signals will be less than the voltage swing at the driver. For example, the driver may be configured to drive data with a voltage swing of +1.5 volts high and 0 volts low. However, at the far end of the wire, the voltage swing may only be between +1.3 volts high and 0.2 volts low due to far end termination to avoid reflection problems. If the impedance of the driver is lowered, the slew rate at the far end increases, but the swinc distance also increases thus somewhat negating the benefit of the increased slew rate. However, driver of the present invention allows the impedance of the driver to be lowered during transitions between logical states by enabling the precompensating driver, but keeping the impedance of the driver the same at other times. Thus, the driver of the present invention provides an increase slew rate at the far end of the wire without increasing the voltage swing, thereby increasing the eye opening allowing the logic at the other end of the wire sufficient time to ascertain the logical state of data it receives.

The eye opening needs to be as large as possible to enable downstream latches as well as other components to accurately determine the state of the bit signal at any one time. Thus, by increasing the slew rate and correspondingly the eye opening, the data can be driven at a faster rate.

Precompensating drivers, as disclosed herein, are more cost effective than discrete passive equalizers and are easily designed in silicon CMOS processes. Over long lossy transmission media, it has been shown that the higher frequency signals experience both pulse width distortion and pulse amplitude reduction. The result is added jitter and a smaller eye opening. The present precompensating driver amplifies the higher frequency component of the data signal without degrading the low frequency component of the data signal. Thus, the present invention provides a data driver with less cross-over jitter and a larger eye opening.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A data driver, comprising:
   a non-precompensating driver generating non-precompensating output data from input data;
   a precompensating driver generating a precompensating pulse in response to a transition from one data state to a second data state between consecutive input data when selectively enabled;
   a composite output connection for combining the non-precompensating output data and the precompensating pulse; and
   at least one selectable delay for delaying the generation of the precompensating pulse to a point in time that results in a substantially optimum slew rate of a data output.

2. The data driver as recited in claim 1, wherein the data driver is incorporated near the edge of a chip.

3. The data driver as recited in claim 1, wherein the precompensating driver generates the precompensating pulse for every data bit when a low-impedance mode is enabled.

4. A data driver, comprising:
   a non-precompensating driver generating non-precompensating output data from input data;
   a precompensating driver generating a precompensating pulse in response to a transition from one data state to a second data state between consecutive input data when selectively enabled;
   a composite output connection for combining the non-precompensating output data and the precompensating pulse;

a transparent latch for producing a delayed input data pulse that is delayed by a half a clock cycle; and an exclusive OR gate for comparing the delayed input data pulse with a current input data pulse wherein the exclusive or gate generates a precompensating enable signal that is coupled to the precompensating driver that enables the precompensating driver to generate the precompensating pulse when the logical state of the current input data pulse is different from the logical state of the delayed input data pulse.

5. The data driver as recited in claim 4, further comprising:

an inverter with an input coupled to the output of the exclusive OR gate for generating a complementary precompensating driver enable signal.

6. The data driver as recited in claim 5, further comprising:

at least one selectable delay between the inverter and the precompensating driver to delay the complementary precompensating enable signal by an amount of time resulting in a substantially optimal slew rate for a data output.

7. A data processing system, comprising:

a component chip; and a bus coupled to the component chip; wherein the component chip includes a data driver for driving data onto the bus and the data driver comprises:
  a non-precompensating driver generating non-precompensating output data from input data;
  a precompensating driver generating a precompensating pulse in response to a transition from one data state to a second data state between consecutive data when selectively enabled;
  a composite output connection for combining the non-precompensating output data and the precompensating pulse; and
  at least one selectable delay for delaying the generation of the precompensating pulse to a point in time that results in a substantially optimum slew rate of a data output.

8. The data processing system as recited in claim 7, wherein the data driver is incorporated near the edge of a chip.

9. The data processing system as recited in claim 7, wherein the data processing system is a general purpose computer.

10. The data processing system as recited in claim 7, wherein the data processing system is a personal digital assistant.

11. The data processing system as recited in claim 7, wherein the component chip is a processor.

12. The data processing system as recited in claim 7, wherein the data processing system is a telephone.

13. The data processing system as recited in claim 12, wherein the telephone is a wireless telephone.

14. The data processing system as recited in claim 7, wherein the precompensating driver generates the precompensating pulse for every data bit when a low-impedance mode is enabled.

15. A data processing system, comprising:

a component chip; and a bus coupled to the component chip; wherein the component chip includes a data driver for driving data onto the bus and the data driver comprises:
  a non-precompensating driver generating non-precompensating output data from input data;
  a precompensating driver generating a precompensating pulse in response to a transition from one data state to a second data state between consecutive data when selectively enabled;
  a composite output connection for combining the non-precompensating output data and the precompensating pulse;
  a transparent latch for producing a delayed input data pulse that is delayed by a half a clock cycle; and
  an exclusive OR gate for comparing the delayed input data pulse with a current input data pulse wherein the exclusive or gate generates a precompensating enable signal that is coupled to the precompensating driver that enables the precompensating driver to generate the precompensating pulse when the logical state of the current input data pulse is different from the logical state of the delayed input data pulse.

16. The data processing system as recited in claim 15, further comprising:

an inverter with an input coupled to the output of the exclusive OR gate for generating a complementary precompensating driver enable signal.

17. The data processing system as recited in claim 16, further comprising:

at least one selectable delay between the inverter and the precompensating driver to delay the complementary precompensating enable signal by an amount of time resulting in a substantially optimal slew rate for a data output.

18. A data driver, comprising:

a non-precompensating driver generating non-precompensating output data from input data, wherein the non-precompensating driver receives a first data input if the data driver is in boundary scan mode and receives a second data input if the data driver is not in boundary scan mode;

a precompensating driver generating a precompensating pulse in response to a transition from one data state to a second data state between consecutive input data when selectively enabled; and a composite output connection for combining the non-precompensating output data and the precompensating pulse.

19. The data driver of claim 18, wherein the first data input is delayed by a delay value to form the second data input.

20. The data driver of claim 19, wherein the delay value is one half clock cycle.

* * * * *